United States Patent
Moheban et al.

(10) Patent No.: US 10,581,433 B1
(45) Date of Patent: Mar. 3, 2020

(54) METHOD AND APPARATUS FOR TRANSMITTING SIGNALS OVER LONG DISTANCES ON AN INTEGRATED CIRCUIT DEVICE

(71) Applicant: Marvell Israel (M.I.S.L) Ltd., Yokne'am (IL)

(72) Inventors: Lior Moheban, Nes Ziona (IL); Jacob Jul Schroder, Lyngby (DK); Yuval Peled, Kiryat Ono (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 0 days.

(21) Appl. No.: 16/566,378

(22) Filed: Sep. 10, 2019

Related U.S. Application Data

(60) Provisional application No. 62/733,506, filed on Sep. 19, 2018.

(51) Int. Cl.
| | | |
|---|---|---|
| *H03K 19/173* | (2006.01) | |
| *H03K 19/177* | (2006.01) | |
| *H03K 19/17704* | (2020.01) | |
| *H03K 5/00* | (2006.01) | |

(52) U.S. Cl.
CPC ... *H03K 19/1737* (2013.01); *H03K 19/17716* (2013.01); *H03K 2005/0026* (2013.01)

(58) Field of Classification Search
CPC ......... H03K 19/1737; H03K 19/17716; H03K 2005/0026
See application file for complete search history.

(56) References Cited

U.S. PATENT DOCUMENTS

| | | | | |
|---|---|---|---|---|
| 5,852,370 A | * | 12/1998 | Ko | H03K 19/0013 326/81 |
| 6,650,142 B1 | * | 11/2003 | Agrawal | H03K 19/17728 326/39 |
| 7,233,166 B2 | * | 6/2007 | Kanapathippillai | G06F 1/3203 326/31 |

* cited by examiner

*Primary Examiner* — Daniel D Chang

(57) ABSTRACT

An integrated circuit device includes dispatcher circuitry that receives signals from a first number of sources, multiplexes the signals into a single mixed signal in a predetermined order, and transmits the mixed signal to a destination via a mixed signal interface having an arbitrary length and operating at an interface clock frequency equal to a product of a device clock frequency and the first number. A second number of samplers is disposed in series along the mixed signal interface, outputting a sampled mixed signal synchronized to the interface clock. A chain of tracking elements in series, corresponding in number to the second number, outputs a tracking indication separate from the sampled mixed signal. Capture circuitry demultiplexes the sampled mixed signal into a plurality of demultiplexed signals, according to a starting point based on the tracking indication, onto a plurality of signal buses corresponding in number to the first number.

20 Claims, 5 Drawing Sheets

US 10,581,433 B1

METHOD AND APPARATUS FOR TRANSMITTING SIGNALS OVER LONG DISTANCES ON AN INTEGRATED CIRCUIT DEVICE

CROSS REFERENCE TO RELATED APPLICATION

This disclosure claims the benefit of commonly-assigned U.S. Provisional Patent Application No. 62/733,506, filed Sep. 19, 2018, which is hereby incorporated by reference herein in its entirety.

FIELD OF USE

This disclosure relates to transmitting signals on an integrated circuit device. More particularly, this disclosure relates to methods and apparatus for transmitting the signals over arbitrarily long multiplexed buses on the integrated circuit device.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

For the purpose of this disclosure, the term "bus signal" may include any signal that is propagated over an entire device—e.g., clocks, reset signals, enable signals, etc.—as well any signal that is propagated over less than an entire device, but over a portion of the device that encompasses multiple functional blocks of the device, including signals transmitted between those functional blocks.

As devices become larger, the number of bus signals grows, necessitating more buses, which consume device area that could otherwise be devoted to functional circuitry. At the same time, buses become longer, requiring the addition of buffers to meet signal slew and capacitance requirements, and the addition of samplers to meet any required clock frequency, in an arrangement sometimes referred to as "pipelining." These additional components compound the problem, further increasing the portion of the device devoted bus signals.

SUMMARY

An integrated circuit device according to implementations of the subject matter of this disclosure includes dispatcher circuitry configured to receive signals from a first number count of signal sources, to multiplex the signals into a single mixed signal according to a predetermined order, and to transmit the single mixed signal to a signal destination via a mixed signal interface having an arbitrary length, the mixed signal interface operating at an interface clock frequency equal to a product of a device clock frequency and the first number count. Such an integrated circuit device also includes a second number count of samplers disposed along the mixed signal interface and connected in series, each of the samplers being configured to sample the mixed signal and to output a sampled mixed signal that is synchronized to the interface clock, a chain of tracking elements, corresponding in number to the second number count and connected in series, and configured to output a tracking indication that is separate from the sampled mixed signal, and capture circuitry coupled to a last sampler among the second number count of samplers and to a last tracking element among the second number count of tracking elements. The capture circuitry is configured to receive the sampled mixed signal and to demultiplex the sampled mixed signal according to a starting point based on the tracking indication received from the last tracking element, and to output, to a plurality of signal buses corresponding in number to the first number count, a plurality of demultiplexed signals corresponding to the signals from the first number count of signal sources that were multiplexed into the mixed signal, according to the starting point.

In a first implementation of such an integrated circuit device, the tracking indication output by the chain of tracking elements may be representative of the second number count. The tracking indication output by the chain of tracking elements and representative of the second number count may indicates the second number count, modulo the first number count.

In such an implementation, each respective one of the tracking elements may output a respective number that is an increment by '1', modulo the first number count, of a respective value input to the respective one of the tracking elements, and the dispatcher circuitry may output a static '0' to input into the chain of tracking elements.

In a variant of the first implementation, the first number count may be '2', and the tracking indication output by the chain of tracking elements may indicate whether the second number count is odd or even.

In that variant, the chain of tracking elements may a chain of inverters connected serially, and the dispatcher circuitry may output a static '1' to input into the chain of tracking elements. The capture circuitry may include a respective memory unit corresponding to each respective signal bus, and selector logic configured to select a respective memory unit for output based on the tracking indication. The selector logic may include a first output multiplexer and a second output multiplexer. Each of the first output multiplexer and the second output multiplexer hay have as inputs the device clock and an inverse of the device clock; and the first output multiplexer and the second output multiplexer may be oppositely controlled by the tracking indication.

In a second implementation of such an integrated circuit device, the capture circuitry may include a FIFO memory having a plurality of memory slots corresponding in number to the first number count, selector logic configured to output data from the FIFO memory onto one of the signal buses, a selection counter configured to operate at the interface clock frequency, and to count modulo the first number count, and a sampler count determination unit configured to output a value representative of the tracking indication output by the chain of tracking elements. The selector logic may be configured to select the one of the output buses based on output of the selection counter. The selector logic may be further configured to output data from a slot in the FIFO memory determined by the starting point, and the selection counter may start counting at the starting point.

In a variant of that second implementation, the sampler count determination unit may be a subtractor, the first number count may be input as a subtrahend of the subtractor, and the signal output by the chain of tracking elements may be input as a minuend of the subtractor.

In a third implementation of the subject matter of this disclosure, the second number count of samplers, and the chain of tracking elements, may be separate. In a fourth implementation of the subject matter of this disclosure, each tracking element in the chain of tracking elements may be integral with a corresponding sampler in the second number count of samplers.

A method according to implementations of the subject matter of this disclosure for propagating input signals from a first number count of signal sources to output signal buses corresponding in number to the first number count via a mixed signal interface of arbitrary length, wherein each signal source in the first number count of signal sources and each bus in the first number count of output signal buses operates at a device clock frequency, includes multiplexing the plurality of input signals onto the mixed signal interface according to a predetermined order, the mixed signal interface operating at an interface clock frequency equal to a product of the device clock frequency and the first number count. The method further includes, in such implementations, sampling the mixed signal interface to maintain clock timing over the arbitrary length of the mixed signal interface, using a second number count of samplers disposed along the mixed signal interface and connected in series, providing a chain of tracking elements, corresponding in number to the second number count and connected in series, and configured to output a tracking indication that is separate from the sampled mixed signal, and demultiplexing signals on the mixed signal interface onto the plurality of output signal buses, including controlling the demultiplexing using the tracking indication output by the chain of tracking elements.

In a first implementation of such a method, the providing the chain of tracking elements may include providing logic that outputs a signal representative of the second number count. The providing the chain of tracking elements may include providing circuitry that outputs a signal indicating the second number count, modulo the first number count. Each respective one of the tracking elements may output a respective number that is an increment by '1' of a respective value input to the respective one of the tracking elements, modulo the first number count, while the method may further include inputting a static '0' to the chain of tracking elements.

In a second implementation of such a method, the demultiplexing may include determining a sampler count representative of the second number count of tracking elements and deriving from the sampler count a starting point to reconstruct the predetermined order, outputting data from a slot in a FIFO memory determined by the starting point, and selecting one of the output buses based on the starting point.

In a third implementation of such a method, the first number count may be equal to '2', the providing the chain of tracking elements may include providing a chain of inverters connected serially, and the method may further include inputting a static '1' into the chain of tracking elements.

In such a third implementation, a respective memory unit may correspond to each respective output signal bus, and the demultiplexing may include selecting a respective memory unit for output based on output of the chain of tracking elements. The demultiplexing may further include reconstructing the predetermined order by selecting a first memory unit for output on a rising edge of the output of the chain of tracking elements, and selecting a second memory unit for output on a falling edge of the output of the chain of tracking elements.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1A:
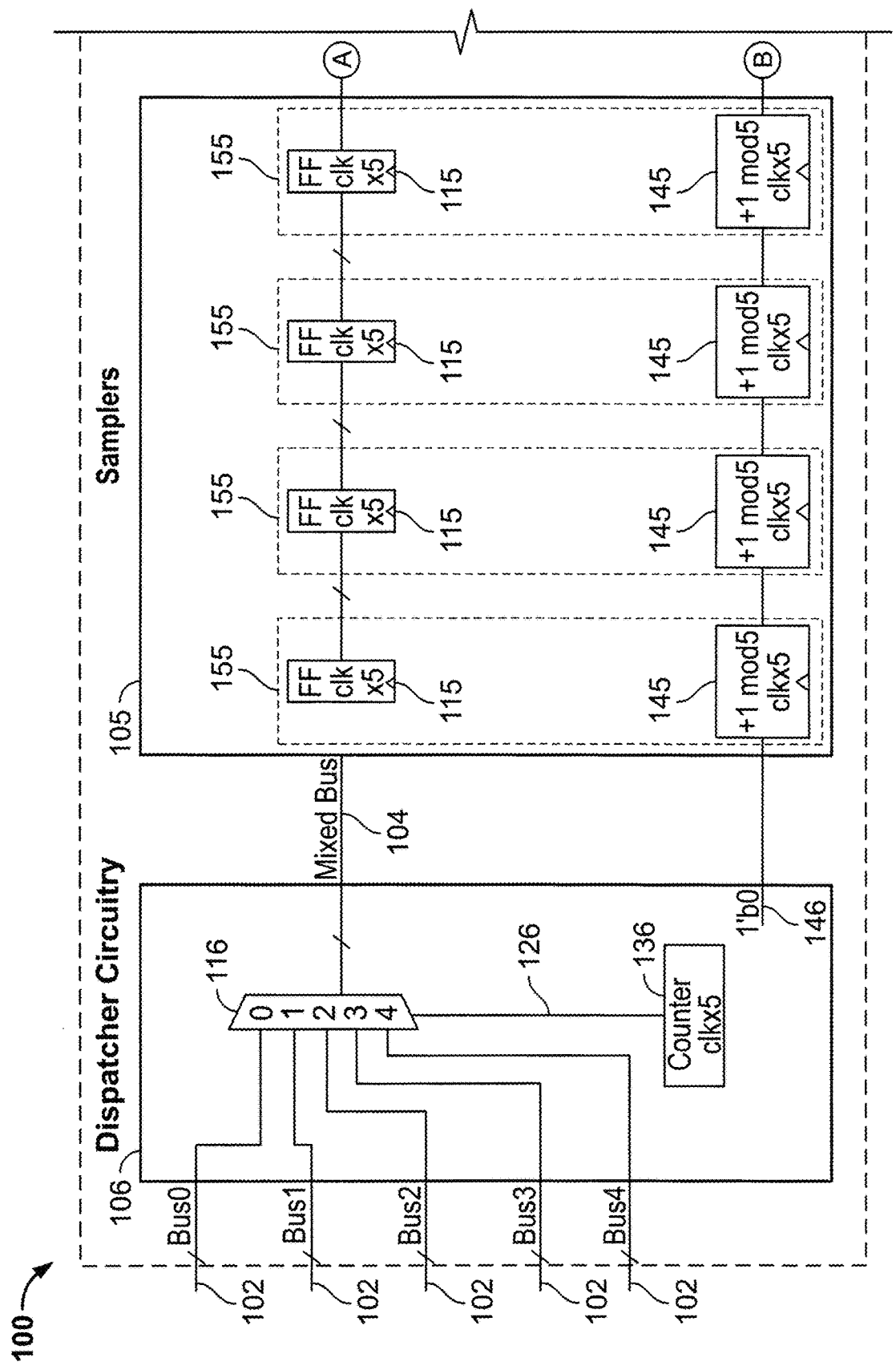
FIGS. 1A and 1B (hereinafter referred to collectively as FIG. 1) show a schematic representation of an implementation of the subject matter of this disclosure in which modulo-n adders are used to keep track of data in a sampler pipeline of arbitrary length.

One technique that may be used to reduce the device area consumed by buses is to multiplex a plurality of signal sources onto a single physical bus (which may include one or multiple physical conductors). Thus, on a device with a device clock frequency f, a plurality n of input signals may be multiplexed, or "dispatched," onto a single physical bus which is overclocked by a factor of n at a frequency nf.

However, long buses, even when multiplexed, still require buffers to meet signal slew and capacitance requirements, and samplers (e.g., registers or flip-flops) to meet frequency requirements. The degree of such pipelining differs from device to device, depending on bus length, which is a function, at least in part, of both device size and the route of a particular bus. In order to demultiplex, or "capture," the individual input signals from the multiplexed bus signals, the number of pipeline stages must be known because that number affects the timing of the arrival of particular individual bus signals among plural multiplexed signals on the particular bus. Therefore, it has heretofore been necessary to create custom demultiplexer or capture circuitry for every device based on the pipeline length.

In accordance with implementations of the subject matter of this disclosure, a mixed signal bus or interface having an arbitrary bus pipeline length is supported. This is accomplished by inserting, for each sampler in the chain of samplers in a bus pipeline, a corresponding modulo-n +1-adder, where n is the aforementioned multiplexing/overclocking factor. Thus, a chain of modulo-n +1-adders exists in parallel with the chain of samplers in the pipeline. The modulo-n +1-adders can be separate elements, or one modulo-n +1-adder can be built into each sampler in the chain of samplers.

Each modulo-n +1-adder simply adds '1' to its input. A static zero is inserted into the input of the first of the modulo-n +1-adders in the chain of modulo-n +1-adders, so that the output of the full chain of modulo-n +1-adders is the number, modulo-n, of modulo-n +1-adders, which is equal to the number, modulo-n, of samplers in the chain of samplers—i.e., if there are m samplers and m<n, the output of the chain of modulo-n +1-adders is m, but if m≥n, the output of the chain of modulo-n +1-adders is the remainder of m/n.

The modulo-n adders thus act as tracking elements to track the number of samplers or pipeline stages. The capture or demultiplexer circuitry uses the modulo-n count of the number of pipeline stages to select the correct sample to output onto the correct one of the n demultiplexed buses of frequency f, in the manner described below.

The arrangement described above can be used for any n. However, for n=2, a simplified arrangement of tracking elements can be used in which the chain of m modulo-n +1-adders, which in this case would be a chain of m modulo-2 +1-adders, is replaced by a chain of m inverters. As described in more detail below, for this case of n=2, using a chain of m inverters, instead of a chain of m modulo-n +1-adders, simplifies the clocking of the capture or demultiplexer circuitry. The case of n=2 also simplifies the clocking of the dispatcher or multiplexer circuitry.

Figure 1B:
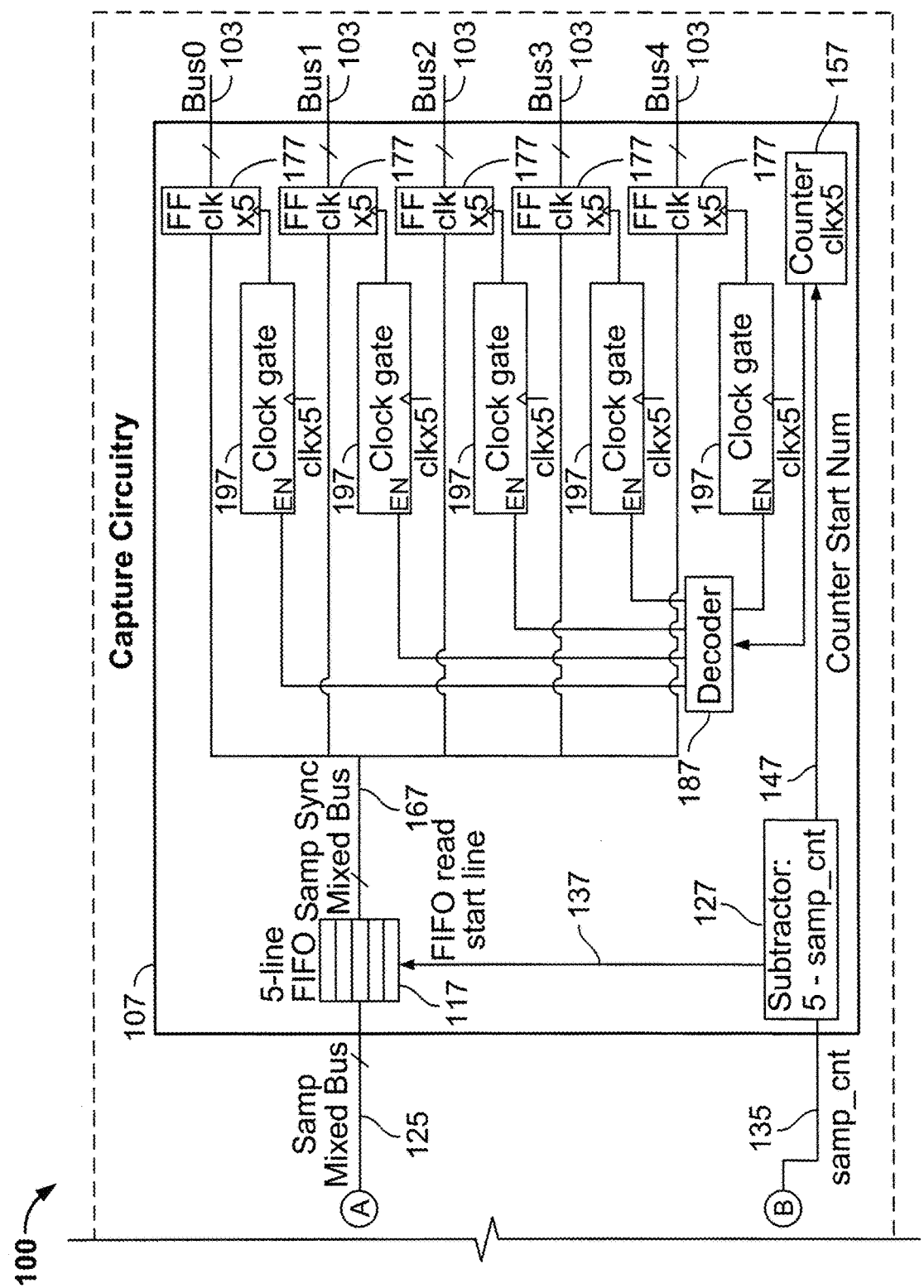

FIG. 1 shows an implementation 100 of the subject matter of this disclosure where n=5 and m=4. That is, there are five input signal buses 102 and five output buses 103, all running at the device clock frequency f and multiplexed together as mixed signal interface or mixed bus 104, and, based on the length of mixed bus 104 in this particular implementation 100, there are four stages, meaning four samplers (shown as flip-flops) 115, connected in series in sampler or pipeline stage 105.

The five input signal buses 102 are multiplexed onto mixed bus 104 by multiplexing, or "dispatcher," circuitry 106. Dispatcher circuitry 106 includes an arbiter 116, which is implemented by an n:1 (in this case, 5:1) multiplexer, whose selection signal 126 is provided by a counter 136 clocked at nf (in this case, 5×f) to provide a mixed signal interface clock. Thus, in one cycle of device clock f, arbiter 116 will select one sample from each of buses 102, which it outputs at 5×f onto mixed bus 104 in a predetermined order based on selection signal 126. Dispatcher circuitry 106 also outputs a static '0' signal 146, which is input to the first modulo-n +1-adder 145 in the chain of m modulo-n +1-adders 145, each modulo-n +1-adder 145 corresponding to one of samplers 115 in sampler or pipeline stage 105. The adders 145 can be separate from the samplers 115, or each adder 145 can be integral with its corresponding sampler 115 as indicated by dashed boxes 155.

The outputs of pipeline 105—including both the output of the chain of samplers 115 on sampled mixed bus 125, and sampler count output 135 from the chain of m modulo-n +1-adders 145—are both output from pipeline stage 105 and are input to demultiplexer or capture stage 107, still at an interface clock frequency nf.

In demultiplexer or capture stage 107, the data on sampled mixed bus 125 is input to an n-line (in this case, 5-line) FIFO memory 117. Each sample, originally from a separate one of input signal buses 102, is read into a respective line of n-line FIFO memory 117. Samples are read out of FIFO memory 117 based on selector logic, as follows. Sampler count output 135 is input along with n to a sampler count determination unit 127. In this case, sampler count determination unit 127 is a subtractor, of which sampler count output 135 is the minuend, and n is the subtrahend. Sampler count determination unit 127 outputs the quantity n−sampler_ count as both FIFO read start line number 137 and demultiplexer counter start number 147. That is, during the demultiplexing or capture process, n-line FIFO memory 117 starts outputting from line n−sampler_count, while demultiplexer selection counter 157 starts counting at a number equal to n−sampler_count and counts modulo-n. In the implementation shown, n−sampler_count=5−4=1, so 5-line FIFO memory 117 starts outputting from line 1 (out of lines '0' through '4'), and demultiplexer selection counter 157 starts counting from '1', and counts modulo-5.

As noted above, demultiplexer or capture stage 107, still operates at a clock frequency nf. Thus, at every interval 1/nf, the sample in the next line of n-line FIFO memory 117 is read out onto sampler synched mixed bus 167 which conducts that sample to all of n output flip-flops 177. Decoder 187, based on the output of demultiplexer selection counter 157, activates the appropriate clock gate 197 to select the correct one of output flip-flops 177 so that the sample present in each of the n output flip-flops 177 is output only onto the correct one of the n individual output buses 103.

Various factors affect the number of samplers 115 that are needed in a particular mixed bus 104. Samplers 115 are needed to maintain device timing constraints. For example, if data transported along mixed bus 104 needs to reach the next processing node within a clock cycle of the device, then as the length of mixed bus 104 increases, the resulting increased transit time along mixed bus 104 may prevent the data from reaching the next processing node within one clock cycle, necessitating sampling the data at points along mixed bus 104 so that the data is available to be processed in the next clock cycle. Because a particular mixed bus 104 can have any length depending on device size, the routing of mixed bus 104 on the device, etc., the number of samplers 115 will vary.

In the case of a single-signal bus, the number of samplers 115 does not affect the order of the output signal. However, for a mixed-signal bus, the number of samplers will affect demultiplexing operations, because it will affect the number of clock signals necessary for a particular input signal to reach the demultiplexing circuitry. If the number of signals is an integer multiple of the number of samples, then the signals can be demultiplexed by associating a particular location in a FIFO or circular buffer with a particular output bus. But if the number of signals is not an integer multiple of the number of samples, then the association of a particular buffer location with a particular output bus must be shifted to accommodate the mismatch.

The circuitry shown in FIG. 1 and described above performs the necessary shifting. The amount of shifting needed is equal not to the number of samplers 115, but to the modulus of the number of signals multiplexed onto mixed bus 104 and the number of samplers 115—i.e., the remainder of the quotient of the number of signals multiplexed onto mixed bus 104 and the number of samplers 115.

Figure 2:
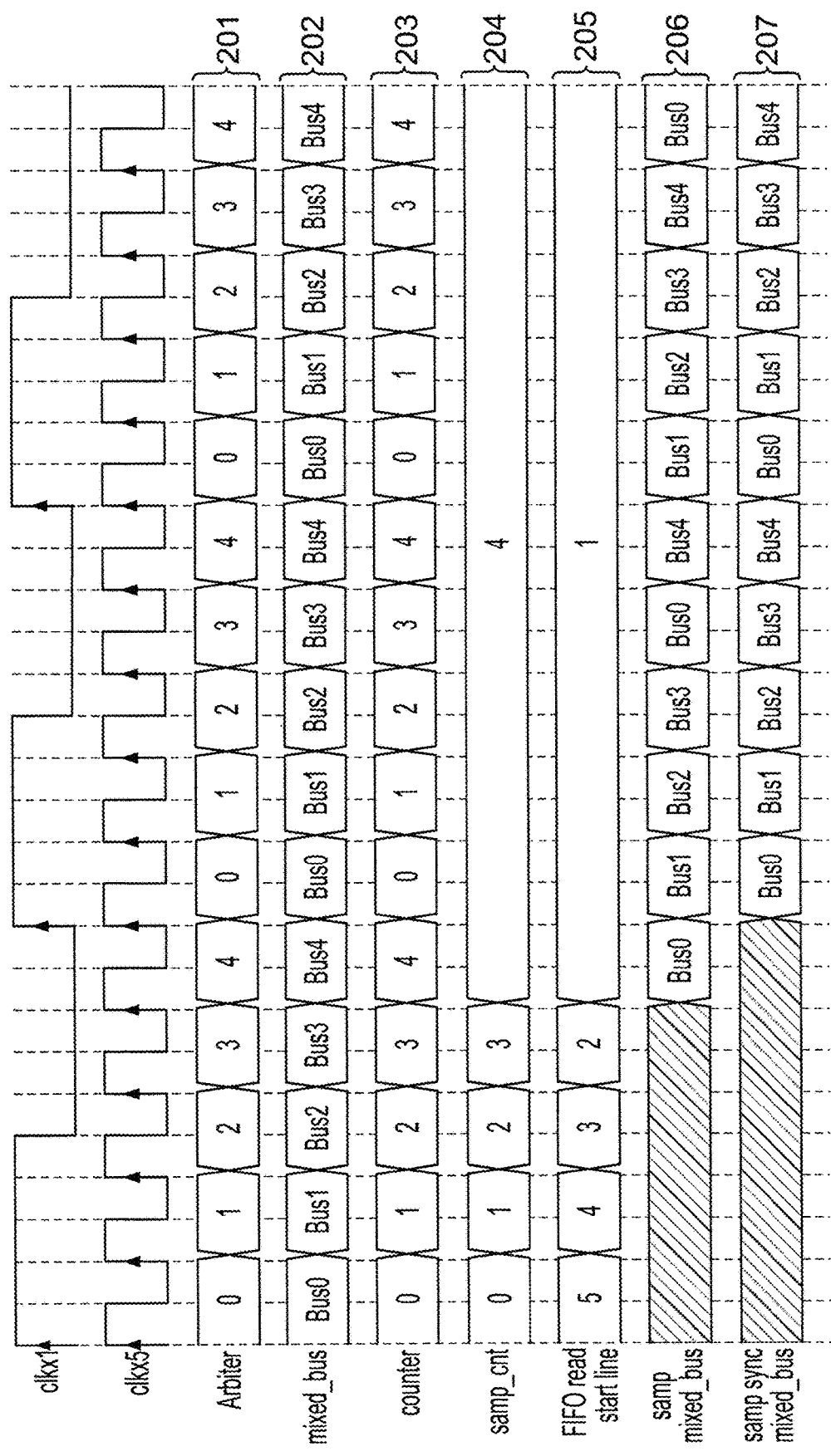
FIG. 2 is a timing diagram of the implementation of FIG. 1.

This is shown in the example timing diagram 200 in FIG. 2. The order of data 202 on mixed bus 104 matches the selection order 201 of arbiter 116. In this example, after five cycles of counter 203 (corresponding to the number of buses 102, 103 multiplexed onto mixed bus 104), a steady state is reached in which the sampler count 204 is equal to '4' and the FIFO read start line 205, indicating the starting point in FIFO 117, is equal to '1', signifying the second position in FIFO 117. Therefore, while the data 206 on sampled mixed bus 125 is one sample off from the data 202 on mixed bus 104, the data 207 on sampler synched mixed bus 167, as read from FIFO 117 based on the starting point indicated by FIFO read start line 205 and presented at output flip-flops 177, matches up with the data 202 input to sampler pipeline stage 105 on mixed bus 104, reconstructing the predetermined order.

Figure 3:
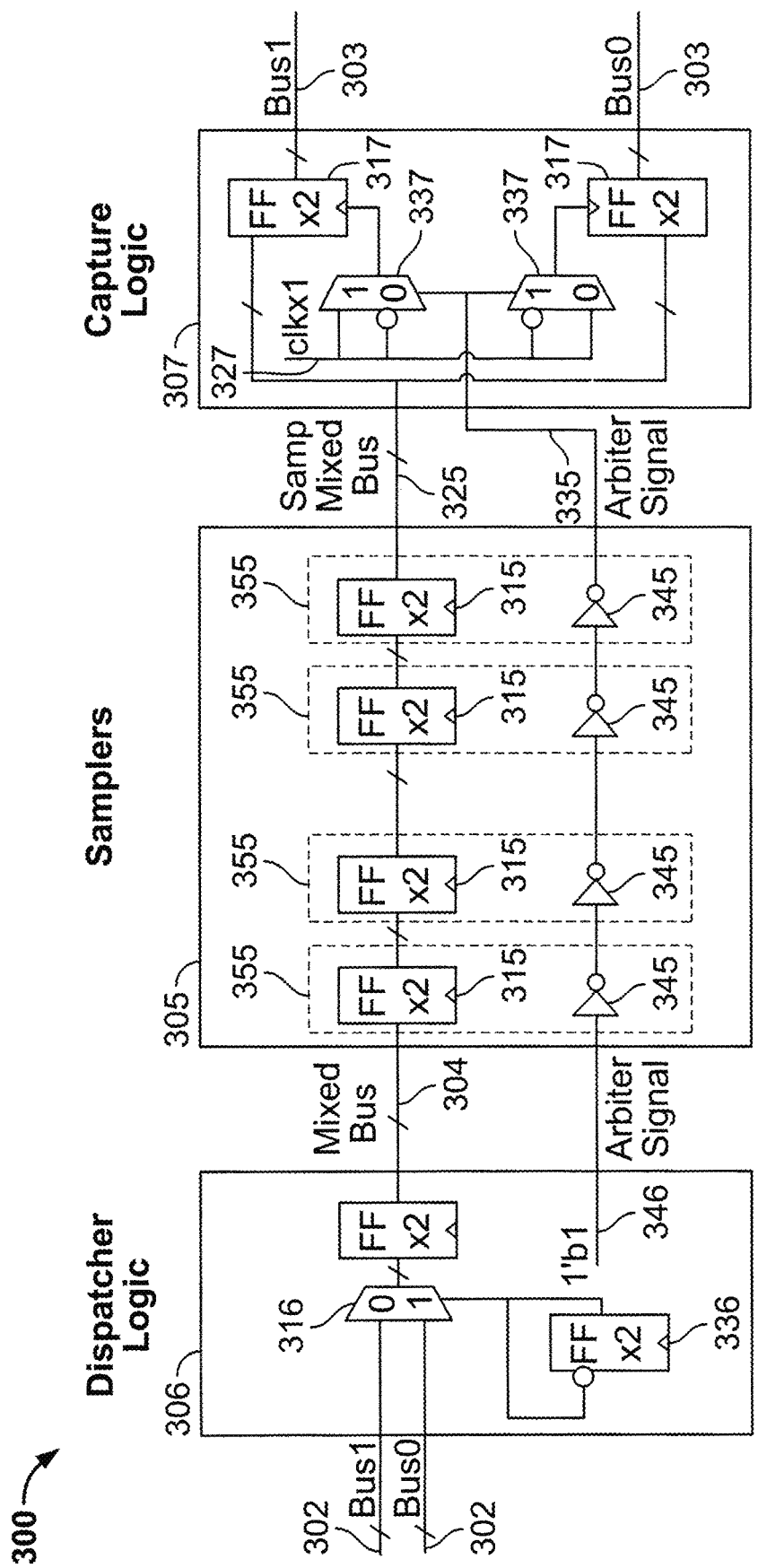
FIG. 3 is a schematic representation of a simplified implementation of the subject matter of this disclosure having only two input buses, in which inverters are used to keep track of data in a sampler pipeline of arbitrary length.

FIG. 3 shows a simplified implementation 300 of the subject matter of this disclosure where n=2 and m=4. That is, there are two input signal buses 302 and two output buses 303, all running at the device clock frequency f and multiplexed together as mixed bus 304, and, based on the length of mixed bus 304 in this particular implementation 300, there are four stages, meaning four samplers (shown as flip-flops) 315, in sampler or pipeline stage 305.

The two input signal buses 302 are multiplexed onto mixed bus 304 by multiplexing, or dispatcher, circuitry 306. Dispatcher circuitry 306 includes an arbiter 316, which is implemented by an n:1 (in this case, 2:1) multiplexer. In this simpler implementation 300, instead of being provided by an overclocked counter 136 clocked at nf (in this case 2×f), selection signal 326 is provided by an overclocked flip-flop 336 clocked at nf (in this case, 2×f) whose output is inverted and fed back to its input, thus alternating between '0' and '1' to select between the two inputs to arbiter 316. Thus, in one cycle of device clock f, arbiter 316 will select one sample from each of buses 302, which it outputs at 2×f onto mixed bus 304. Dispatcher circuitry 306 also outputs a static '1' signal 346, which is input to the first inverter of chain of m inverters 345, each inverter 345 corresponding to one of samplers 315 in sampler or pipeline stage 305. The inverters 345 can be separate from the samplers 315, or each inverter 345 can be integral with its corresponding sampler 315 as indicated by dashed boxes 355.

The outputs of pipeline 305—including both the output of the chain of samplers 315 on sampled mixed bus 325, and arbiter output 335 from the chain of m inverters 345—are both output from pipeline stage 305 and are input to demultiplexer or capture stage 307, still at a clock frequency nf=2×f.

In demultiplexer or capture stage 307, the data on sampled mixed bus 325 is input to two separate output flip-flops 317—one for bus 0 and one for bus 1. Because there are only two choices, flip-flops 317 are separately clocked on the rising or falling edge of system clock 327 operating at 1×f to select one of flip-flops 317 as the output, based on whether m is odd or even. Whether a particular one of flip-flops 317 is clocked on the rising or falling edge is determined by how clock 327 is selected by multiplexers 337 based on arbiter output 335 from the chain of m inverters 345, which is '0' or '1' depending on whether m is odd or even, respectively.

It is noted that both the dispatcher clocking and the capture clocking are substantially simpler in implementation 300 as compared to implementation 100. And although arbiter output 335 propagates all the way through sampler pipeline 305, because arbiter output 335 is static, there is no need to close timing on arbiter output 335.

Figure 4:
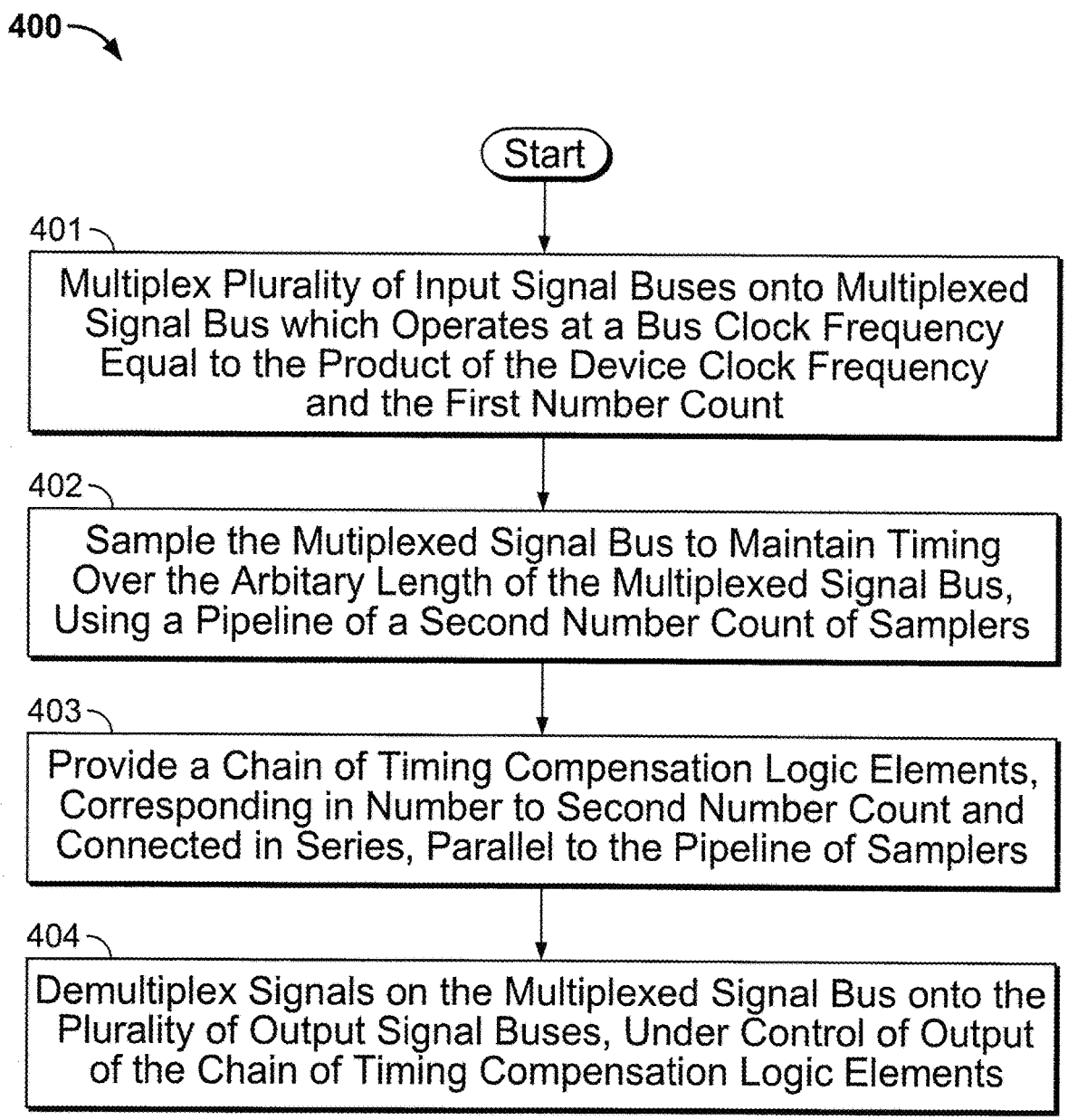
FIG. 4 is a flow diagram of an implementation of a method according to the subject matter of this disclosure.

A method of operating a multiplexing arrangement according to an implementation 400 of the subject matter of this disclosure, is diagrammed in FIG. 4.

Implementation 400 starts at 401, where a plurality of input signal buses are multiplexed onto a multiplexed signal bus which operates at a bus clock frequency equal to the product of the device clock frequency and the first number count (which corresponds to the number of input signal buses). Next, at 402, the multiplexed signal bus is sampled to maintain timing over its arbitrary length, using a pipeline of a second number count of samplers. At 403, a chain of timing compensation logic elements, corresponding in number to the second number count and connected in series, is provided parallel to the pipeline of samplers. Then, at 404, signals on the multiplexed signal bus are demultiplexed onto the plurality of output signal buses, under control of the output of the chain of timing compensation logic elements, and implementation 400 ends.

Thus it is noted that a multiplexing arrangement for pipelined buses on an integrated circuit device, which supports arbitrarily long pipelines without custom timing circuitry, has been provided.

As used herein and in the claims which follow, the construction "one of A and B" shall mean "A or B."

It is further noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An integrated circuit device, comprising:
   dispatcher circuitry configured to receive signals from a first number count of signal sources, to multiplex the signals into a single mixed signal according to a predetermined order, and to transmit the single mixed signal to a signal destination via a mixed signal interface having an arbitrary length, the mixed signal interface operating at an interface clock frequency equal to a product of a device clock frequency and the first number count;
   a second number count of samplers disposed along the mixed signal interface and connected in series, each of the samplers being configured to sample the mixed signal and to output a sampled mixed signal that is synchronized to the interface clock;
   a chain of tracking elements, corresponding in number to the second number count and connected in series, and configured to output a tracking indication that is separate from the sampled mixed signal; and
   capture circuitry coupled to a last sampler among the second number count of samplers and to a last tracking element among the second number count of tracking elements, the capture circuitry being configured to receive the sampled mixed signal and to demultiplex the sampled mixed signal according to a starting point based on the tracking indication received from the last tracking element, and to output, to a plurality of signal buses corresponding in number to the first number count, a plurality of demultiplexed signals corresponding to the signals from the first number count of signal sources that were multiplexed into the mixed signal, according to the starting point.

2. The integrated circuit device of claim 1 wherein the tracking indication output by the chain of tracking elements is representative of the second number count.

3. The integrated circuit device of claim 2 wherein the tracking indication output by the chain of tracking elements and representative of the second number count indicates the second number count, modulo the first number count.

4. The integrated circuit device of claim 3 wherein:
   each respective one of the tracking elements outputs a respective number that is an increment by '1', modulo the first number count, of a respective value input to the respective one of the tracking elements; and
   the dispatcher circuitry outputs a static '0' to input into the chain of tracking elements.

5. The integrated circuit device of claim 2 wherein:
   the first number count is '2'; and
   the tracking indication output by the chain of tracking elements indicates whether the second number count is odd or even.

6. The integrated circuit device of claim 5 wherein:
   the chain of tracking elements is a chain of inverters connected serially; and
   the dispatcher circuitry outputs a static '1' to input into the chain of tracking elements.

7. The integrated circuit device of claim 6 wherein:
   the capture circuitry comprises:
   a respective memory unit corresponding to each respective signal bus; and selector logic configured to select a respective memory unit for output based on the compensation indication.

8. The integrated circuit device of claim 7 wherein:
the selector logic comprises a first output multiplexer and a second output multiplexer;
each of the first output multiplexer and the second output multiplexer has as inputs the device clock and an inverse of the device clock; and
the first output multiplexer and the second output multiplexer are oppositely controlled by the tracking indication.

9. The integrated circuit device of claim 1 wherein:
the capture circuitry comprises:
a FIFO memory having a plurality of memory slots corresponding in number to the first number count,
selector logic configured to output data from the FIFO memory onto one of the signal buses,
a selection counter configured to operate at the interface clock frequency, and to count modulo the first number count, and
a sampler count determination unit configured to output a value representative of the tracking indication output by the chain of tracking elements;
the selector logic is configured to select the one of the output buses based on output of the selection counter;
the selector logic is further configured to output data from a slot in the FIFO memory determined by the starting point; and
the selection counter starts counting at the starting point.

10. The integrated circuit device of claim 9 wherein:
the sampler count determination unit is a subtractor;
the first number count is input as a subtrahend of the subtractor; and
the signal output by the chain of tracking elements is input as a minuend of the subtractor.

11. The integrated circuit device of claim 1 wherein the second number count of samplers, and the chain of tracking elements, are separate.

12. The integrated circuit device of claim 1 wherein each tracking element in the chain of tracking elements is integral with a corresponding sampler in the second number count of samplers.

13. A method of propagating input signals from a first number count of signal sources to output signal buses corresponding in number to the first number count via a mixed signal interface of arbitrary length, wherein each signal source in the first number count of signal sources and each bus in the first number count of output signal buses operates at a device clock frequency; the method comprising:
multiplexing the plurality of input signals onto the mixed signal interface according to a predetermined order, the mixed signal interface operating at an interface clock frequency equal to a product of the device clock frequency and the first number count;
sampling the mixed signal interface to maintain clock timing over the arbitrary length of the mixed signal interface, using a second number count of samplers disposed along the mixed signal interface and connected in series;
providing a chain of tracking elements, corresponding in number to the second number count and connected in series, and configured to output a tracking indication that is separate from the sampled mixed signal; and
demultiplexing signals on the mixed signal interface onto the plurality of output signal buses, including controlling the demultiplexing using the tracking indication output by the chain of tracking elements.

14. The method of claim 13 wherein the providing the chain of tracking elements comprises providing logic that outputs a signal representative of the second number count.

15. The method of claim 14 wherein the providing the chain of tracking elements comprises providing circuitry that outputs a signal indicating the second number count, modulo the first number count.

16. The method of claim 15, wherein each respective one of the tracking elements outputs a respective number that is an increment by '1' of a respective value input to the respective one of the tracking elements, modulo the first number count; the method further comprising:
inputting a static '0' to the chain of tracking elements.

17. The method of claim 13 wherein the demultiplexing comprises:
determining a sampler count representative of the second number count of tracking elements and deriving from the sampler count a starting point to reconstruct the predetermined order;
outputting data from a slot in a FIFO memory determined by the starting point; and
selecting one of the output buses based on the starting point.

18. The method of claim 13 wherein:
the first number count is equal to '2'; and
the providing the chain of tracking elements comprises providing a chain of inverters connected serially; the method further comprising:
inputting a static '1' into the chain of tracking elements.

19. The method of claim 18 wherein:
a respective memory unit corresponds to each respective output signal bus; and
the demultiplexing comprises selecting a respective memory unit for output based on output of the chain of tracking elements.

20. The method of claim 19 wherein the demultiplexing comprises reconstructing the predetermined order by:
selecting a first memory unit for output on a rising edge of the output of the chain of tracking elements; and
selecting a second memory unit for output on a falling edge of the output of the chain of tracking elements.

* * * * *